(12) United States Patent
Fan et al.

(10) Patent No.: US 6,400,004 B1
(45) Date of Patent: Jun. 4, 2002

(54) LEADLESS SEMICONDUCTOR PACKAGE

(75) Inventors: Alex Fan, Taoyuan; Daniel Chen, Nantou Hsien; Rick Chiu, Taoyuan; Jack Kuo, Jungli; Roger Chiu, Hsinchu Hsien; Jim Li, Taipei, all of (TW)

(73) Assignee: Advanced Semiconductor Engineering, Inc., Koahsiung (TW)

( * ) Notice: Subject to any disclaimer, the term of this patent is extended or adjusted under 35 U.S.C. 154(b) by 0 days.

(21) Appl. No.: 09/640,549

(22) Filed: Aug. 17, 2000

(51) Int. Cl.[7] .............................. H01L 23/495
(52) U.S. Cl. ................ 257/666; 257/690; 257/670; 257/692; 438/123
(58) Field of Search ................ 257/702–796, 257/690, 666, 674, 696, 692, 676; 438/106, 123, 661, 124

(56) References Cited

U.S. PATENT DOCUMENTS

| | | | |
|---|---|---|---|
| 5,894,108 A | | 4/1999 | Mostafazadeh et al. |
| 6,166,430 A | * | 12/2000 | Yamaguchi |
| 6,208,020 B1 | * | 3/2001 | Minamio et al. ............ 257/684 |

* cited by examiner

Primary Examiner—Douglas Wille
Assistant Examiner—DiLinh Nguyen
(74) Attorney, Agent, or Firm—Dykema Gossett PLLC

(57) ABSTRACT

A leadless semiconductor package mainly comprises a semiconductor chip disposed on a die pad and electrically connected to a plurality of leads arranged around the die pad. There are a plurality of tie bars connected to the die pad. The lower surface of each lead has an indentation formed corresponding to one of the bottom edges of the package. The semiconductor chip, the leads and the tie bars are encapsulated in a package body wherein the lower surface of each lead is exposed from the bottom surface of the package except the indentation thereof.

14 Claims, 6 Drawing Sheets

LEADLESS SEMICONDUCTOR PACKAGE

BACKGROUND OF THE INVENTION

1. Field of the Invention

This invention is related to a lead frame package, and more specifically to a leadless semiconductor package.

2. Description of the Related Art

Lead frame packages has been used for a long period of time in the IC packaging history mainly because of its low manufacturing cost and high reliability. However, as integrated circuits products move its endless pace toward both faster and smaller in size, the traditional lead frame packages become gradually obsolete for some high performance-required packages. Thus BGA (Ball Grid Array packages) and CSP (Chip Scale Package) have emerged and become increasingly popular as a new packaging choice. The former was widely used in IC chips that have higher I/Os and need better electrical and thermal performance than the conventional packages, for examples, CPU and graphic chips. The latter has been widely used in mobile products of which the footprint, package profile, package weight are major concerns.

However, the lead frame package still remains its market share as a cost-effective solution for low I/O ICs. Traditional lead frame package has its limit of providing a chip scale and low profile solution due to the long inner leads and outer leads. Therefore, the semiconductor packaging industry develops a leadless package without outer leads such that both foot print and package profile can be greatly reduced. FIG. 1 shows a bottom view of a leadless package 100 wherein the leads 110a are disposed at the bottom of the package as compared to the conventional gull-wing or J-leaded type package. The die pad 110b of the leadless package 100 is exposed from the bottom of the package thereby providing better power dissipation. Typically, there are four tie bars 110c connected to the die pad 110b.

Due to elimination of the outer leads, leadless packages feature lower profile and light weight. Furthermore, due to the lead length reduction, the corresponding reduction in the resistance, conductance and capacitance make the leadless package 100 very suitable for RF (radio-frequency) product packages operating in several GHz to tens of GHz frequency range. It's also a cost-effective package due to its use of existing BOM (bill of materials). All the above-mentioned properties make the current leadless packages very suitable for telecommunication products such as cellular phones, portable products such as PDA (personal digital assistant), digital cameras, and IA (Information Appliance).

Conventional leadless packaging process comprises the following steps.

Firstly, a polyimide (PI) tape was attached to the bottom of a lead frame, this is to prevent the mold flash problem in the molding process. Typically, a lead frame (denoted as 105 in FIG. 2) for used in the MAP (mold array package) molding process comprises a plurality of units 110 each including a plurality of leads 110a arranged at the periphery of a die pad 110b. Each die pad 110b is connected to the lead frame 105 by four tie bars 110c.

Then, referring to FIG. 3, IC chips 120 are attached to the die pads 110b using silver epoxy, and the epoxy is cured after die attach. After that, a regular wire-bonding process is used to make interconnections between the silicon chips 120 and the leads 110a of the lead frame 105. After wire bonding, the lead frame 105 and the chips 120 attached thereon are encapsulated in a package body 130. Typically, a MAP molding process was used to accomplish this encapsulation. The PI tape is then removed after the molding process. The molded product is then marked with either laser or traditional ink. Finally, post-mold curing and singulation steps were conducted to complete the packaging process. In the singulation process, a resin-bond saw blade is used to cut the molded product into separate units along predetermined dicing lines to obtain the finished leadless semiconductor packages. Typically, the leadless semiconductor package 100 is mounted onto a substrate, such as a printed circuit board (PC board), by using conventional surface mount technology (SMT).

One major problem during the manufacturing of the package occurred in the singulation process. Since the saw blade has to cut through two different materials, ie, the metal leadframe as well as the molding compound. This not only results in shorter blade life, but also creates lead quality problems such as metal burs created at the lead cutting ends 112 of the leads 110a, which will introduce unsatisfactory coplanarity of the finished packages thereby complicating and reducing the yield of the later SMT mounting process.

SUMMARY OF THE INVENTION

It is therefore an object of the present invention to overcome or at least reduce the problems and disadvantages associated with the above-described technique.

It is another object of the present invention to provide a leadless semiconductor package characterized in that the lower surface of each lead has an indentation formed corresponding to one of the bottom edges of the package and the indentation is embedded in the package body such that metal burs created at the lead cutting ends will not appear at the bottom of the package whereby the problems encountered in the surface mount process of the finished package can be avoided.

It is another object of the present invention to provide a lead frame for use in forming leadless semiconductor packages wherein the lead frame comprises a plurality of leads each having an indentation formed corresponding to a predetermined dicing line whereby the above-mentioned troubles during singulation can therefore be solved.

In accordance with the above listed and other objects we discloses a leadless semiconductor package mainly comprising a semiconductor chip disposed on a die pad and electrically connected to a plurality of leads arranged around the die pad. There are a plurality of tie bars connected to the die pad. The lower surface of each lead has an indentation formed corresponding to one of the bottom edges of the package. The semiconductor chip, the leads and the tie bars are encapsulated in a package body wherein the lower surface of each lead is exposed from the bottom surface of the package except the indentation thereof. During the encapsulating process, molding compound will flow into the indentation of each lead; hence, after curing, the indentation is embedded in the package body formed from the molding compound such that metal burs created at the lead cutting ends will not appear at the bottom of the package whereby the problems encountered in the surface mount process of the finished package can be avoided. In the leadless semiconductor package according to the present invention, the upper surface of each lead preferably has a cavity thereby enhancing the bonding between the leads and the package body.

The present invention further provides a lead frame for use in forming leadless semiconductor packages. The lead frame comprises a plurality of units each including a die pad and a plurality of leads arranged around the die pad. The die pad has an upper surface adapted for receiving a semiconductor chip. Each of the leads has opposing upper and lower surfaces wherein the upper surface thereof is coplanar with the upper surface of the die pad and the lower surface thereof has an indentation formed corresponding to a predetermined dicing line. Furthermore, in a preferred embodiment, each lead has a cavity defined in the upper surface thereof.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

Figure 1:
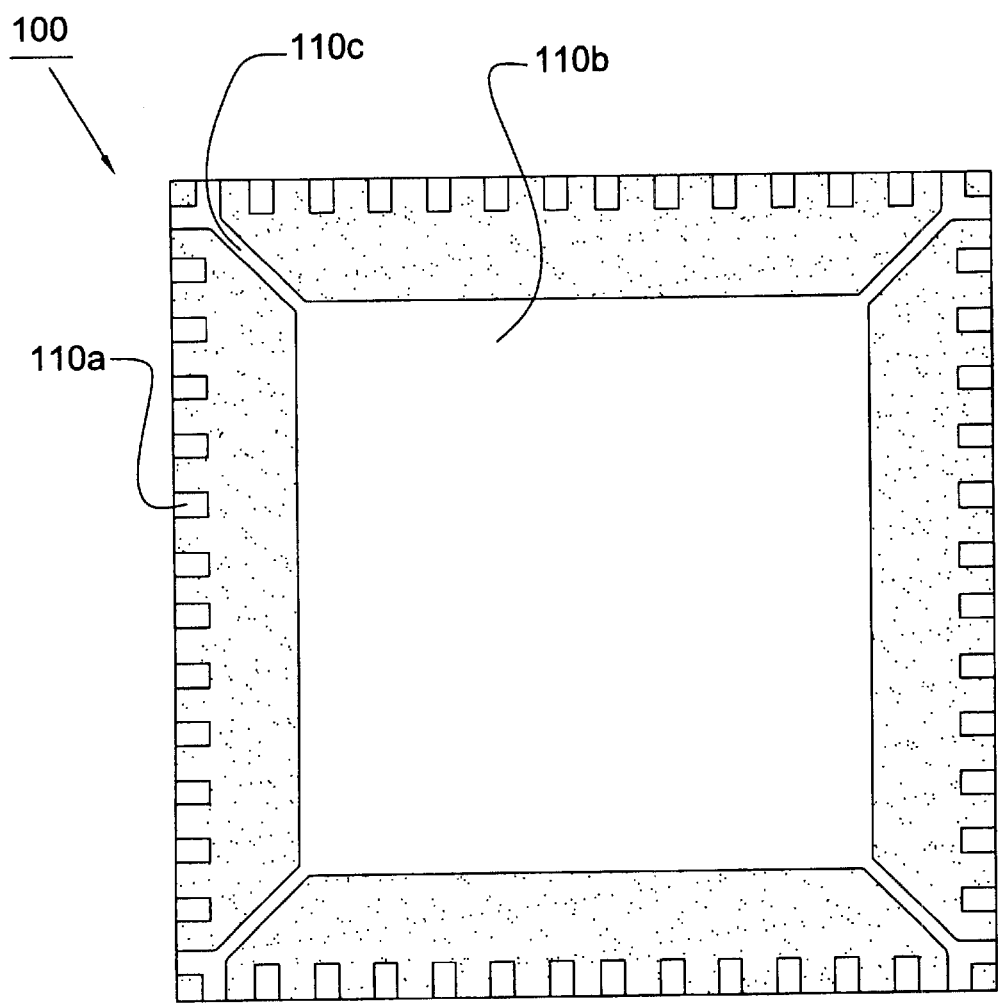
FIG. 1 is a bottom view of a conventional leadless package.
Figure 3:
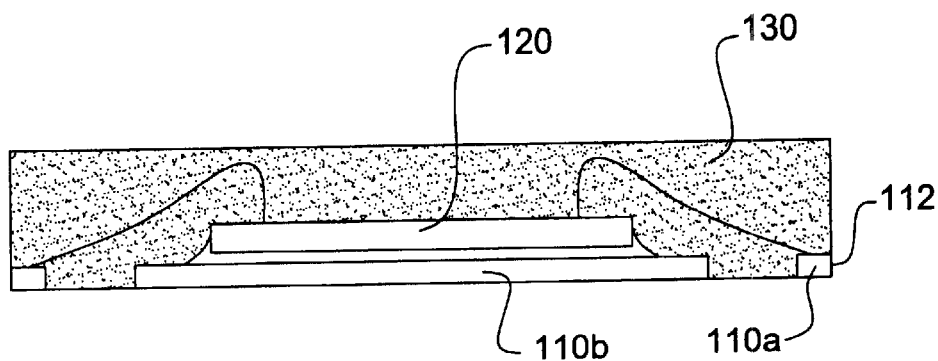
FIG. 3 is a cross sectional view of the conventional leadless package of FIG. 1.
Figure 2:
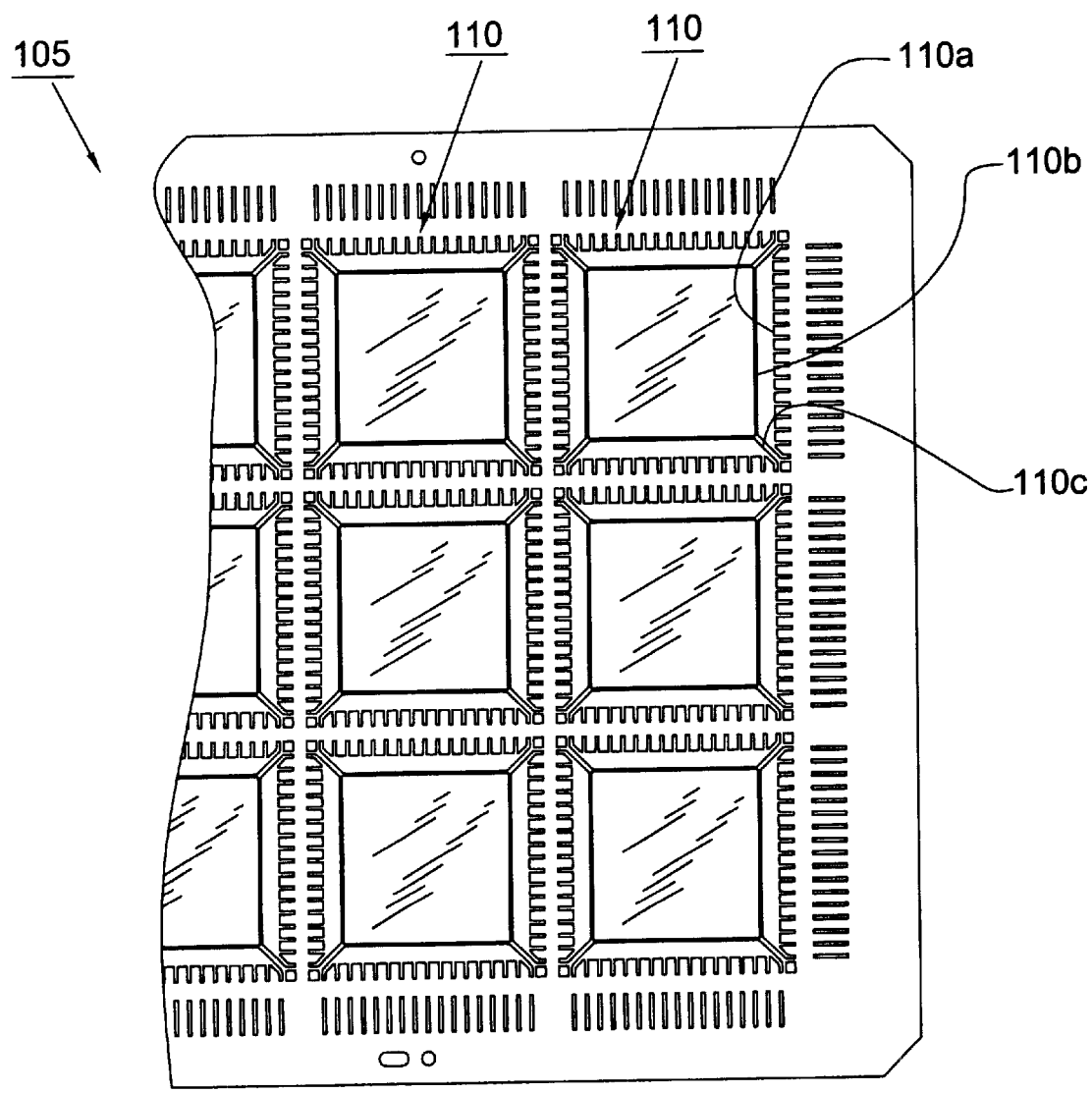
FIG. 2 is a top plan view of a conventional lead frame for use in forming leadless semiconductor packages.
Figure 4:
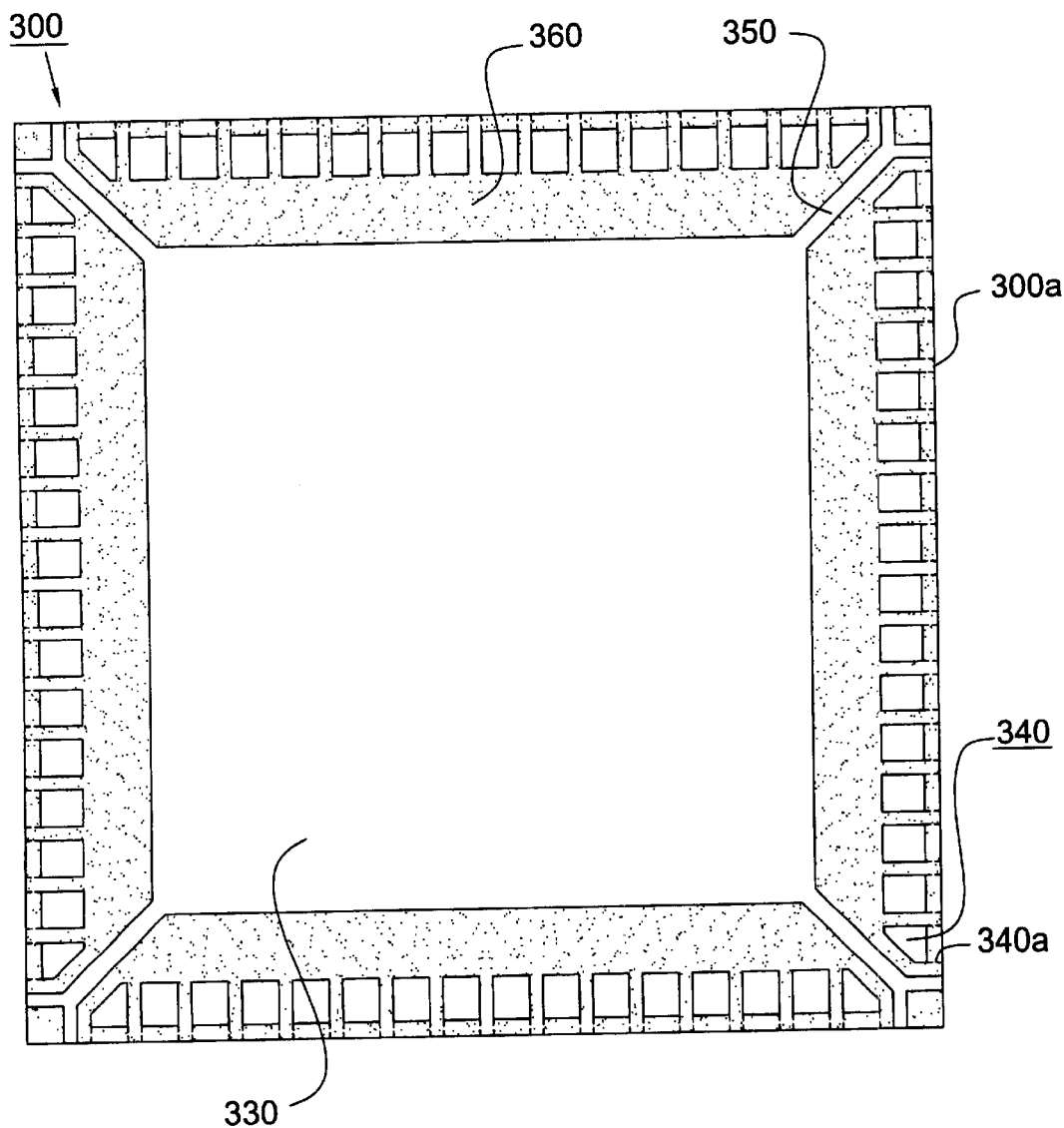
FIG. 4 is a bottom view of a leadless semiconductor package according to a preferred embodiment of the present invention.
Figure 5:
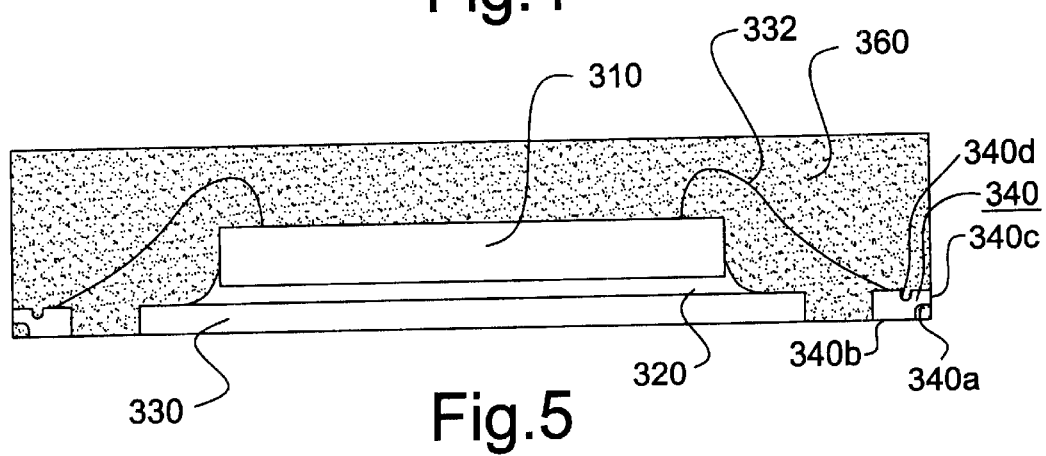
FIG. 5 is a cross sectional view of the leadless semiconductor package of FIG. 4 of the present invention.

FIGS. 4 and 5 disclose a leadless semiconductor package 300 in accordance with a preferred embodiment of the present invention. The package 300 comprises a chip 310 attached to a die pad 330 by a conductive adhesive such as silver paste 320. The active surface of the chip 310 is provided with a plurality of bonding pads electrically connected to leads 340 through bonding wires 332. The leads 340 are arranged at the periphery of the die pad 330. There are four tie bars 350 connected to the die pad 330. Each tie bar extends from a corner of the die pad 330 to a corresponding corner of the leadless semiconductor package 300. The lower surface 340b of each lead 340 has an indentation 340a formed corresponding to one of the bottom edges 300a of the package 300. The semiconductor chip 310, the leads 340 and the tie bars 350 are encapsulated in a package body 360. preferably, the backside surface of the die pad 330 is exposed from the bottom surface of the package 300 thereby enhancing the thermal performance of the package 300. The lower surface 340b of each lead 340 is exposed from the bottom surface of the package 300 except the indentation 340a thereof Referring to FIG. 5, during the encapsulating process, molding compound will flow into the indentation 340a of each lead 340; hence, after curing, the indentation 340a is embedded in the package body 360 formed from the molding compound. Therefore, after singulation, metal burs created at the cutting ends 340c of the leads 340 will not appear at the bottom of the package 300 whereby the problems encountered in the surface mount process of the finished package can be avoided.

The leadless semiconductor package 300 can be mounted onto a substrate, such as a printed circuit board (PC board), like other leadless devices. For example, a PC board is screen printed with a solder paste in a pattern which corresponds to the pattern of the leads 340 exposed from the bottom of the package 300. The package 300 is then appropriately positioned on the PC board and the solder is reflowed by using the conventional surface mount technology. Alternatively, the leads 340 exposed from the bottom of the package 300 can be printed with solder paste and then mounted onto the PC board. In the package 300 of the present invention, the metal burs created after cutting are kept off the bottom of the package to allow a good coplanarity thereby enhancing the yield of the SMT mounting process.

Referring to the FIG. 5, in this preferred embodiment, each lead 340 has a cavity 340d defined in the upper surface thereof. During the encapsulating process, the molding compound will flow into the cavity 340d; hence, after curing, the molding compound will fill the cavity 340d thereby providing mechanical interlock mechanism to strengthen the bonding between the leads 340 and the package body 360.

Figure 6:
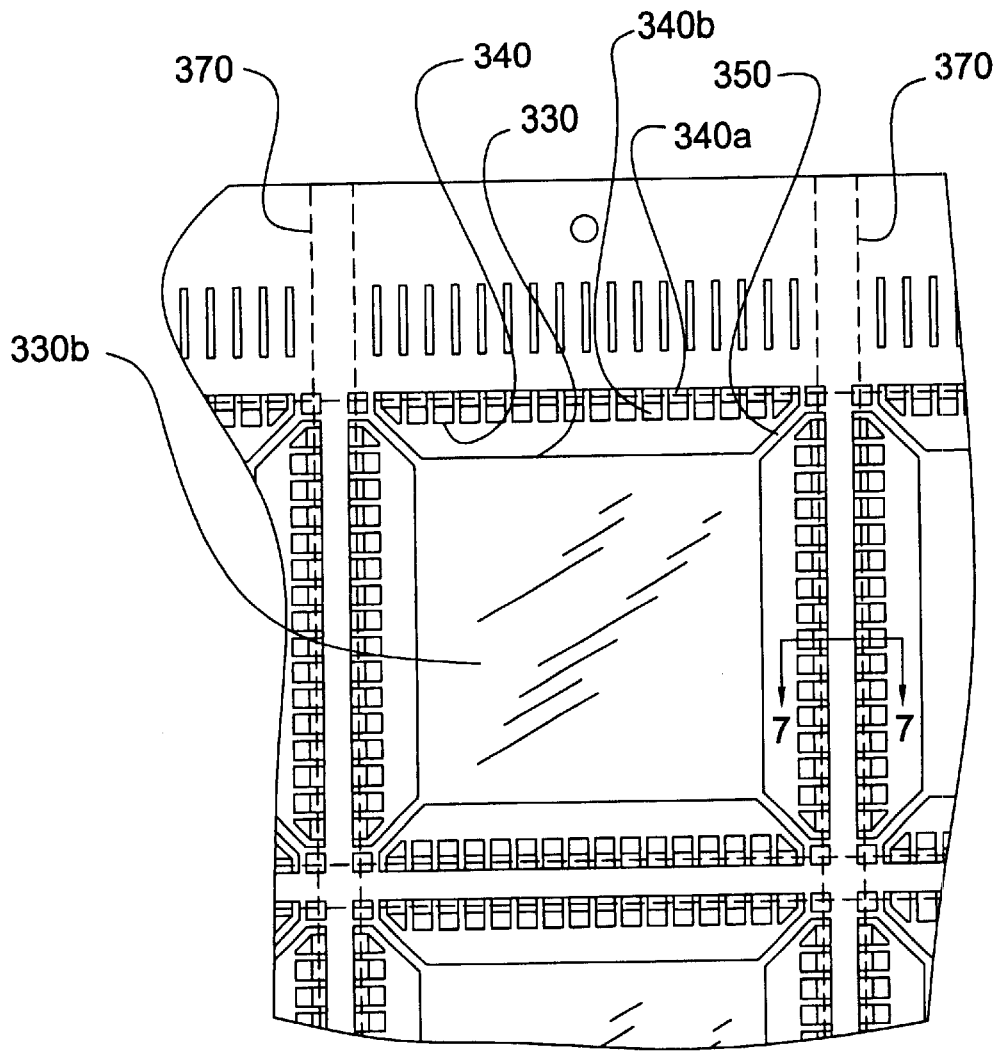
FIG. 6 is a bottom view of a portion of a lead frame in accordance with the present invention.
Figure 7:
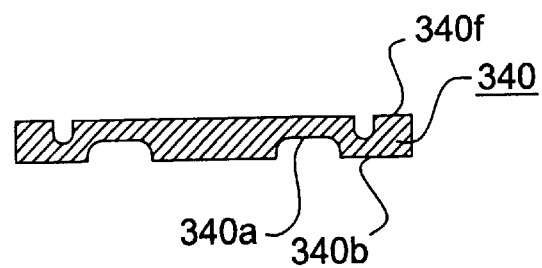
FIG. 7 is a cross sectional view taken from the line 7—7 of FIG. 6 of the present invention.

FIG. 6 is a bottom view of a unit of a lead frame in accordance with the present invention. In mass production, it is desirable to integrally form a plurality of units in a lead frame having alignment holes so that the packaging process (including molding process) can be automated. The units of the lead frame are separated from each other by a plurality of cutting streets. In the lead frame of the present invention, each unit includes a die pad 330 and a plurality of leads 340 arranged at the periphery of the die pad 330. The die pad 330 has an upper surface 330a (see FIG. 8) adapted for receiving a semiconductor chip. The lower surface 330b of the dia pad 330 is coplanar with the lower surface 340b of each lead. Referring to FIGS. 6 and 7, each lead 340 is half-etched at its lower surface 340b to form an indentation 340a at a location corresponding to a predetermined dicing line 370 and closely adjacent to one of the cutting streets 380. Typically, molded product formed by MAP (mold array package) molding process is cut into separate units along the predetermined dicing lines 370 to obtain the finished leadless semiconductor packages.

Figure 8:
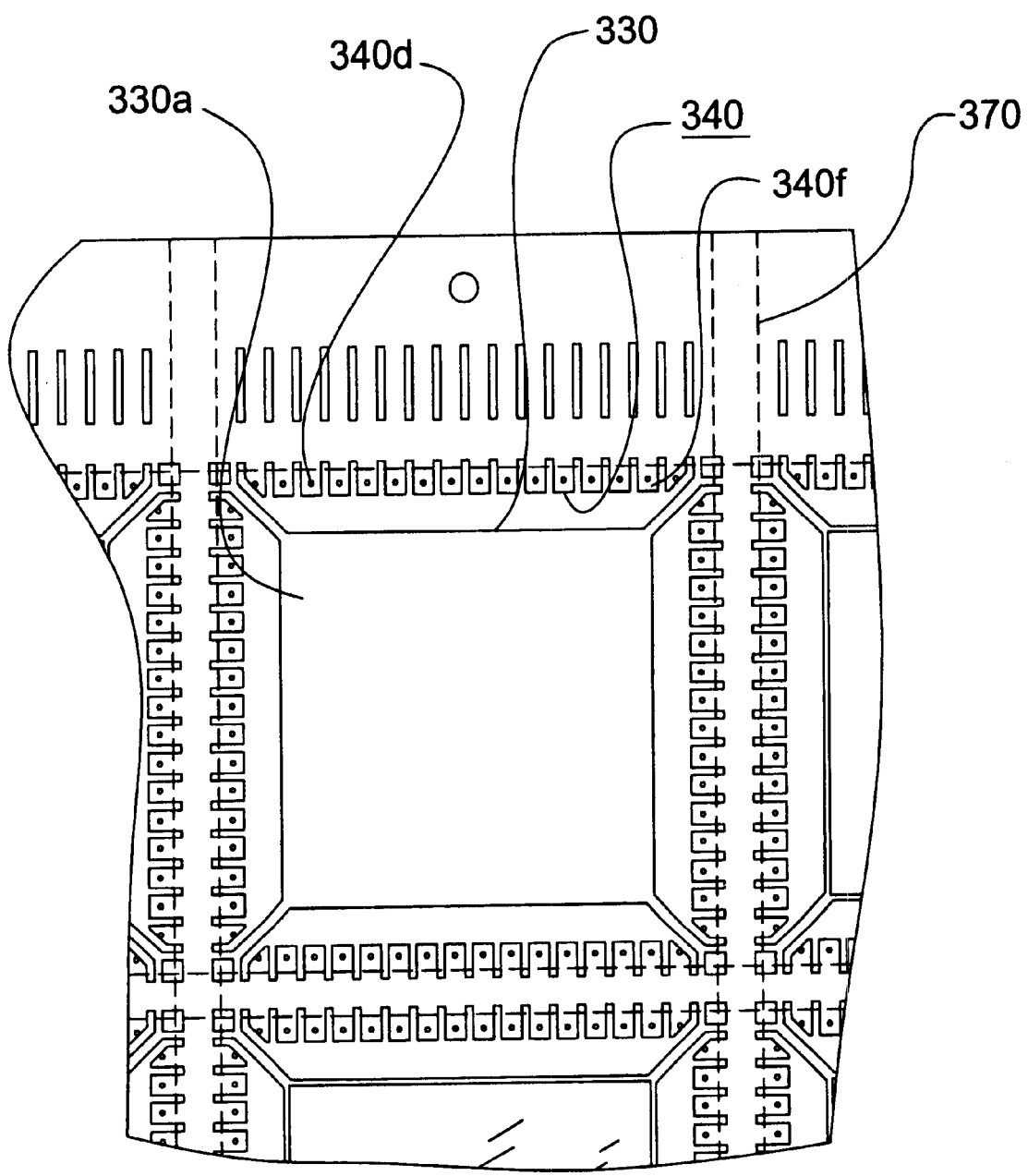
FIG. 8 is a top view of a portion of a lead frame in accordance with the present invention.

FIG. 8 is a top of an unit of the lead frame of FIG. 6 in accordance with the present invention. Preferably, the upper surface of each of the leads 340 has a cavity 340d. The cavity is formed at a position away from the dicing line 370 but closer to the die pad 330. The upper surface 340f of the each lead 340 is coplanar with the upper surface 330a of the die pad 330.

According to a preferred embodiment of the present invention, the lead frame is formed from a thin metal strip. Preferably, the thin metal strip is made of copper or alloys containing copper. Alternatively, the thin metal strip may be made of iron, nickel or alloys thereof, and then plated with copper. Conventional process for use in making a lead frame comprises the following steps of: (a) forming a photoresist layer on the upper and lower surfaces of the thin metal strip by conventional techniques such as dry film lamination. Typically, the photoresist layer is mainly composed of a resin mixture, and a photoactive material which makes the photoresist layer photodefinable; (b) photodefining the photoresist layer through a photomask (not shown) and developing in a manner that areas on both surfaces of the thin metal strip at which they are undesired to be etched are protected by remaining photoresist, e.g., the die pad, the leads and the tie bars; (c) etching areas on both surfaces of the metal strip exposed from the remaining photoresist layer; (d) stripping the remaining photoresist by using conventional techniques; and (e) forming a metal flash on the etched metal strip by using conventional plating techniques. Preferably, the metal flash includes a layer of nickel covering the lead frame, a layer of palladium covering the nickel layer, and a layer of gold covering the palladium layer. The metal flash can help to prevent the die pad and the leads from corrosion or contamination. Furthermore, if the leads of a leadless package have metal flash formed thereon, the tin/lead-plating step can be skipped wherein the tin/lead-plating step is performed before soldering the package to PCB thereby enhancing solderability.

The indentations and the cavities of the present invention can be formed using the conventional process described above without introducing any additional step. That is accomplished by, during step (b), simultaneously transferring a predetermined pattern having the design of the indentations and the cavities integrated therein and developing such that areas on both surfaces of the metal strip at which they are predetermined to form the indentations and the cavities are not covered by the photoresist. This make the leadframe in accordance with the present invention very cost-effective because it's fully compatible with the current leadframe fabricating process.

In the finished lead frame, areas on both surfaces of each lead at which they are predetermined to form the indentation and the cavity are half-etched to form the indentation and the cavity. It is noted that the "half-etching" herein does not mean only exactly removing an half of the thickness of the metal strip through etching but also includes a partial etching for removing merely a part of the thickness of the metal strip.

Figure 9:
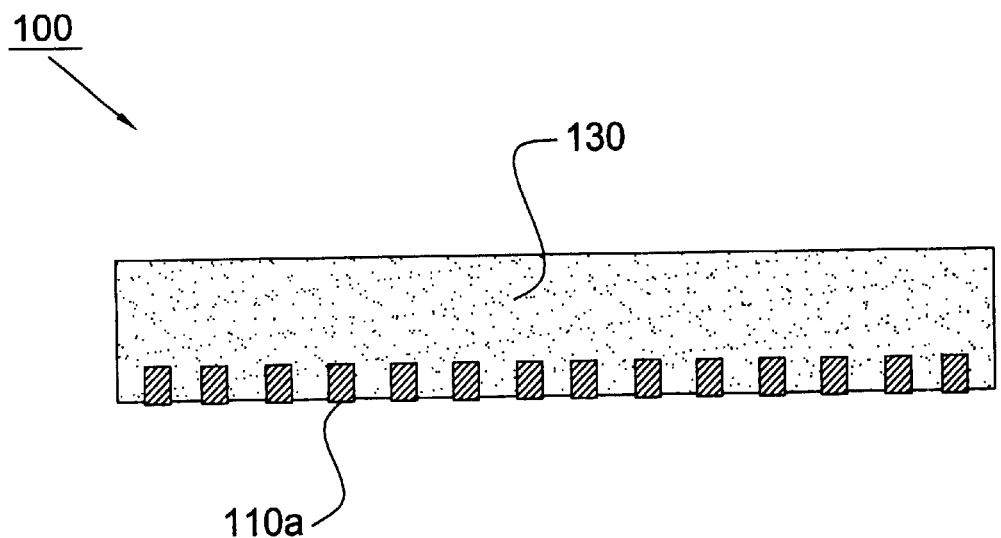
FIG. 9 is a side view of the conventional leadless package of FIG. 1.
Figure 10:
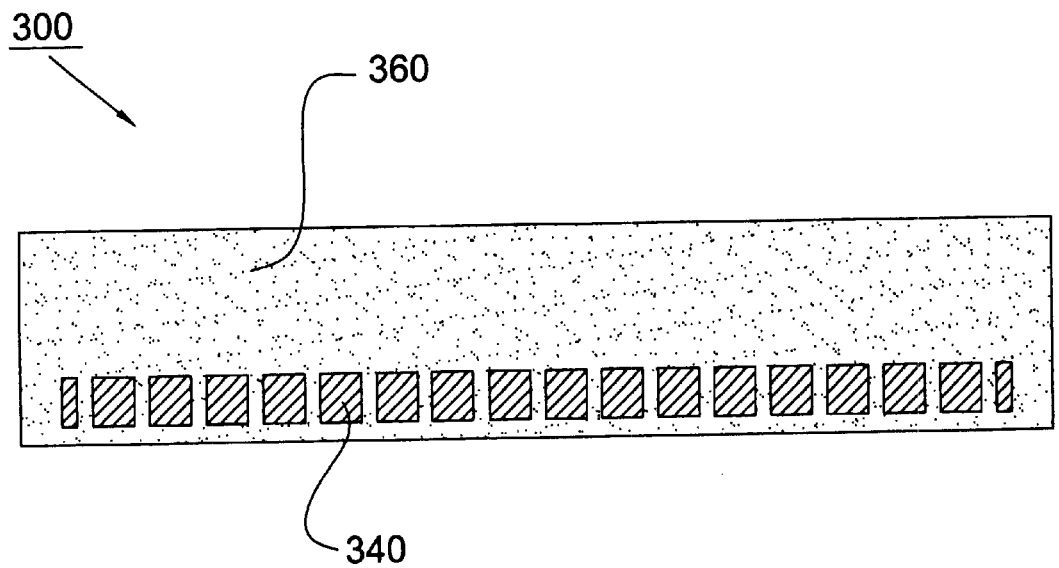
FIG. 10 is a side view of the leadless semiconductor package of FIG. 4 of the present invention.

FIG. 9 is a side view of a conventional leadless package. FIG. 10 is a side view of the leadless semiconductor package in accordance with the present invention. As shown in FIGS. 9, since the lower surface of the lead 110a is totally exposed from the bottom of the package 100, metal burs created after cutting appear at the bottom thereby introducing unsatisfactory coplanarity of the finished packages. However, the leads of the leadless semiconductor package 300 of the present invention each has a half-etched indentation such that metal burs created after cutting will not appear at the bottom of the package thereby ensuring coplanarity thereof.

Although the invention has been explained in relation to its preferred embodiment, it is to be understood that many other possible modifications and variations can be made without departing from the spirit and scope of the invention as hereinafter claimed.

What is claimed is:

1. A leadless semiconductor package having side surfaces and a bottom surface with a plurality of edges comprising:
   a die pad and a plurality of leads arranged about the periphery of the die pad, each of the leads having a cutting end exposed from one of the side surfaces of the package, and opposing upper and lower surfaces, the lower surface of each lead having an indentation formed at a location corresponding to one of the edges of the bottom surface of the package such that the cutting ends of the leads do not show at the bottom surface of the package;
   a plurality of tie bars connecting to the die pad;
   a semiconductor chip disposed on the die pad and electrically coupled to the leads; and
   a package body formed over the semiconductor chip, the leads and the tie bars,
   wherein the lower surface of each lead is exposed from the bottom surface of the package except the indentation thereof.

2. The leadless semiconductor package as claimed in claim 1, wherein the backside surface of the die pad is exposed from the bottom surface of the package.

3. The leadless semiconductor package as claimed in claim 1, wherein the upper surface of each lead has a cavity.

4. A leadless semiconductor package having side surfaces and a bottom surface with a plurality of edges comprising:
   a die pad and a plurality of leads arranged about the periphery of the die pad, each of the leads having a cutting end exposed from one of the side surfaces of the package, and opposing upper and lower surfaces, each of the leads being half-etched at its lower surface to form an indentation at a location corresponding to one of the edges of the bottom surface of the package such that the cutting ends of the leads do not show at the bottom surface of the package;
   a plurality of tie bars connecting to the die pad;
   a semiconductor chip disposed on the die pad and electrically coupled to the leads; and
   a package body formed over the semiconductor chip, the leads and the tie bars,
   wherein the lower surface of each lead is exposed from the bottom surface of the package except the indentation thereof.

5. The leadless semiconductor package as claimed in claim 4, wherein the backside surface of the die pad is exposed from the bottom surface of the package.

6. The leadless semiconductor package as claimed in claim 4, wherein each of the leads is half-etched as its upper surface to form a cavity.

7. The leadless semiconductor package as claimed in claim 6, wherein each of the leads is half-etched to form the indentation and the cavity at the same time.

8. A lead frame for use in forming leadless semiconductor packages, the lead frame comprising:
   a plurality of units; and a plurality of cutting streets between the units,
   each unit including a die pad and a plurality of leads arranged about the periphery of the die pad,
   the die pad having an upper surface adapted for receiving a semiconductor chip,
   each of the leads having opposing upper and lower surface wherein the upper surface thereof is coplanar with the upper surface of the die pad,
   the lower surface of each lead having an indentation formed closely adjacent to one of the cutting streets.

9. The lead frame as claimed in claim 8, wherein the upper surface of each of the leads has a cavity.

10. The lead frame as claimed in claim 9, wherein the cavity is formed at a position away from the dicing line but closer to the die pad.

11. A lead frame for use in forming leadless semiconductor packages, the lead frame comprising:

a plurality of units, and a plurality of cutting streets between the units, each unit including a die pad and a plurality of leads arranged about the periphery of the die pad, the die pad having an upper surface adapted for receiving a semiconductor chip, each of the leads having opposing upper and lower surfaces wherein the upper surface thereof is coplanar with the upper surface of the die pad, each lead being half-etched at its lower surface to form an indentation at a location closely adjacent to one of the cutting streets.

12. The lead frame as claimed in claim 11, wherein each of the leads is half-etched at its upper surface to form a cavity.

13. The lead frame as claimed in claim 12, wherein the cavity is formed at a position away from the dicing line but closer to the die pad.

14. The lead frame as claimed in claim 12, wherein each of the leads is half-etched to form the indentation and the cavity at the same time.

* * * * *